United States Patent [19]
Matsuda et al.

[11] Patent Number: 5,666,270
[45] Date of Patent: Sep. 9, 1997

[54] BUMP ELECTRODE, SEMICONDUCTOR INTEGRATED CIRCUIT DEVICE USING THE SAME, MULTI-CHIP MODULE HAVING THE SEMICONDUCTOR INTEGRATED CIRCUIT DEVICES AND METHOD FOR PRODUCING SEMICONDUTCOR DEVICE HAVING THE BUMP ELECTRODE

[75] Inventors: Tatsuharu Matsuda; Masaharu Minamizawa, both of Kawasaki, Japan

[73] Assignee: Fujitsu Limited, Kawasaki, Japan

[21] Appl. No.: 280,327

[22] Filed: Jul. 25, 1994

[30]   Foreign Application Priority Data

Oct. 18, 1993   [JP]   Japan ................................ 5-260057

[51] Int. Cl.⁶ ........................................................ H05K 7/20
[52] U.S. Cl. ........................ 361/704; 361/705; 439/66; 439/91
[58] Field of Search ................................. 257/736, 737, 257/747, 748; 361/704–708, 717–719, 722, 773, 776, 779, 783, 787; 437/211; 439/66, 91

[56]   References Cited

U.S. PATENT DOCUMENTS

| 4,999,460 | 3/1991 | Sugiyama et al. | 439/66 |
| 5,001,302 | 3/1991 | Atsumi | 439/91 |

FOREIGN PATENT DOCUMENTS 5243231   9/1993   Japan ................................ 257/737

OTHER PUBLICATIONS

Ward, "Pressure Contact Type Chip Join Technique", IBM Tech. Disclosure Bulletin, vol. 18, No. 9, Feb. 1976, p. 2817.

*Primary Examiner*—Leo P. Picard
*Attorney, Agent, or Firm*—Staas & Halsey

[57]   ABSTRACT

A bump electrode includes a core portion provided on an intermediate electrode layer formed on an electrode pad formed on a surface of an element. The core portion contains a material having a Young's modulus less than that of soldering. An electrically conductive film covers the core portion.

20 Claims, 6 Drawing Sheets a : 200 ~ 300 μm
b : 150 ~ 200 μm
c :   50 ~ 150 μm
d :    5 ~  20 μm

FIG. 7A STEP 50

FIG. 7B STEP 51

FIG. 7C STEP 52

FIG. 7D STEP 53

FIG. 7E STEP 54

FIG. 7F STEP 55

BUMP ELECTRODE, SEMICONDUCTOR INTEGRATED CIRCUIT DEVICE USING THE SAME, MULTI-CHIP MODULE HAVING THE SEMICONDUCTOR INTEGRATED CIRCUIT DEVICES AND METHOD FOR PRODUCING SEMICONDUTCOR DEVICE HAVING THE BUMP ELECTRODE

BACKGROUND OF THE INVENTION

Field of the Invention

The present invention generally relates to semiconductor integrated circuit devices, and more particularly to a bump electrode used in such devices. More particularly, the present invention is concerned with a bump electrode for flip chip mounting.

High-density mounting of semiconductor elements has been required to cope with recent demands of speeding-up and down-sizing of computer systems. A flip chip mounting method utilizing bump electrodes is known as a method for achieving high-density mounting of semiconductor elements. In the above flip chip mounting, it has been desired to lengthen the fatigue-based duration of life in regard to a temperature cycle.

SUMMARY OF THE INVENTION

An object of the present invention is to provide a bump electrode having a longer fatigue-based duration of life.

The above object of the present invention is achieved by a bump electrode comprising: a core portion provided on an intermediate electrode layer formed on an electrode pad formed on a surface of an element, the core portion containing a material having a Young's modulus less than that of soldering; and an electrically conductive film covering the core portion. For example, the core portion comprises silicone resin, and the core portion has a dome shape. It is possible to further provide a protection film which covers the electrically conductive film except for a portion of the electrically conductive film. The portion of the electrically conductive film is to be in contact with an electrode formed on a member on which the element should be mounted. The protection film comprises an insulating material.

Another object of the present invention is to provide a semiconductor device equipped with such a bump electrode.

This object of the present invention is achieved by a semiconductor device comprising: a chip; and a plurality of bump electrodes, each of the bump electrodes comprising: a core portion provided on an intermediate electrode layer formed on an electrode pad formed on a surface of the chip, the core portion containing a material having a Young's modulus less than that of soldering; and an electrically conductive film covering the core portion.

The above object is also achieved by a semiconductor device comprising: a chip; a plurality of bump electrodes; a circuit board having pads which are in contact with the plurality of bumps; a package base supporting the circuit board and having terminals connected to the pads; and leads electrically connecting the circuit board to the terminals of the package base. Each of the bump electrodes comprises: a core portion provided on an intermediate electrode layer formed on an electrode pad formed on a surface of the chip, the core portion containing a material having a Young's modulus less than that of solder; and an electrically conductive film covering the core portion.

Yet another object of the present invention is to provide a method for producing the above-mentioned bump electrode.

This object of the present invention is achieved by a method for producing a semiconductor device having a prior art bump electrode as described above, the method comprising the steps of: (a) forming a core portion on an intermediate electrode layer formed on an electrode pad formed on a surface of an element, the core portion containing a material having a Young's modulus less than that of soldering; and (b) forming an electrically conductive film covering the core portion. For example, the step (a) comprises steps of: (a-1) forming an ultraviolet-hardening silicone resin on the surface of the element; and (a-2) patterning the ultraviolet-hardening silicon resin so that a projection of the ultraviolet-hardening silicon resin is formed, the projection corresponding to the core portion of the bump electrode. For example, the step (a-2) further comprises the step of removing edges of the projection. For example, the method further comprises the step (c) of forming a protection film which covers the electrically conductive film except for a portion of the electrically conductive film, the portion of the electrically conductive film to be in contact with an electrode formed on a member on which the element should be mounted, the protection film comprising an insulating material.

BRIEF DESCRIPTION OF THE DRAWINGS

The other objects, features and advantages of the present invention will become more apparent from the following detailed description when read in conjunction with the accompanying drawings, in which.

DESCRIPTION OF THE PREFERRED EMBODIMENTS

To facilitate a better understanding of the present invention, a description will now be given with reference to an art related to the present invention.

Figure 1:
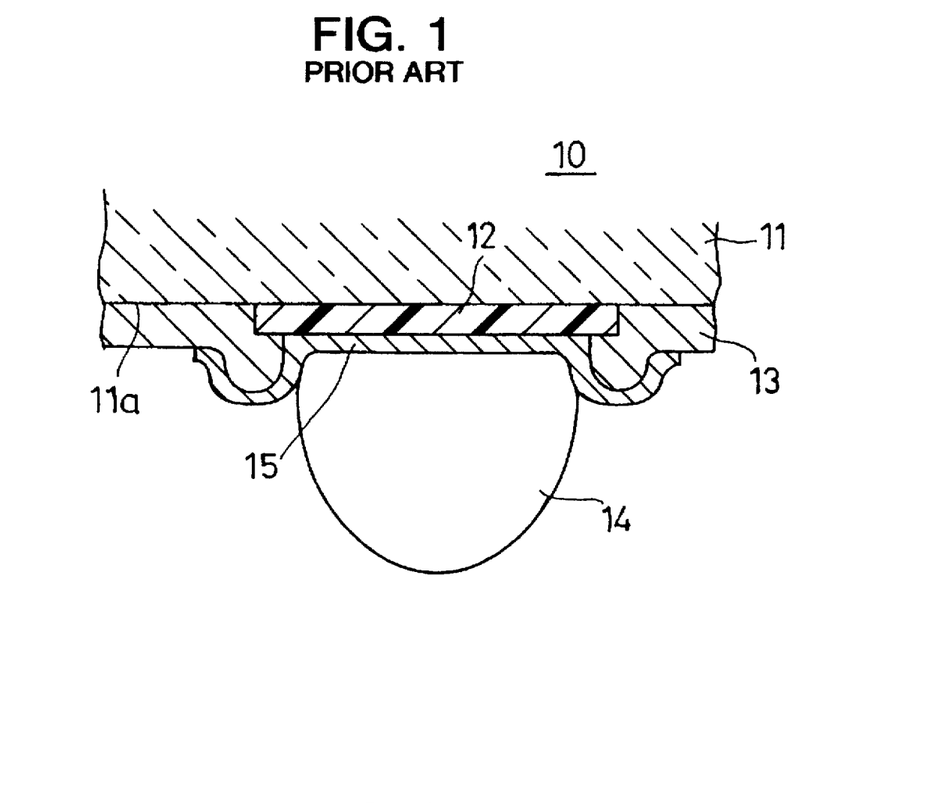
FIG. 1 is a cross-sectional view of a prior art bump electrode related to the present invention.

FIG. 1 is a cross-sectional view of a prior art bump electrode 10 related to the present invention. An electrode pad 12 and a protection film 13 are formed on a lower surface 11a of a semiconductor element 11. The bump electrode 10 is formed so that a soldering bump 14 is provided on the electrode pad 12 via a metallic intermediate layer 15.

Figure 2:
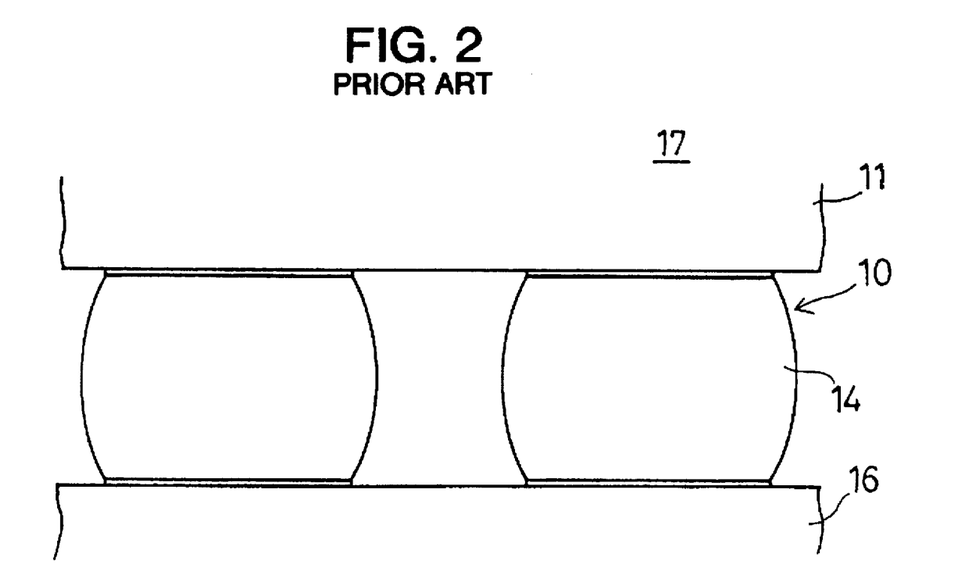
FIG. 2 is an enlarged side view of flip-chip mounting utilizing the bump electrode shown in FIG. 1.

FIG. 2 shows a semiconductor device 17 in which the semiconductor element 11 equipped with the bump electrode 10 is flip-chip mounted on a mounting circuit board 16. The semiconductor device 17 radiates heat during operation. When the semiconductor device 17 stops operating, it is cooled to the room temperature and subjected to a temperature cycle.

The soldering bump 14 is an alloy of Pb/Sn (9:1), and the Young's modulus is as high as $1.9 \times 10^3$ (kgf/mm$^2$), so that the soldering bump 14 is not likely to deform. Generally, the semiconductor element 11 is made of silicon, and the coefficient of thermal expansion thereof is $3.5 \times 10^{-6}$ (1/°C.). The mounting circuit board 16 is made of AlN or glass epoxy resin. The coefficient of thermal expansion of AlN is $4.2 \times 10^{-6}$ (1/°C.), and the coefficient of thermal expansion of glass epoxy resin is $12.0 \times 10^{-6}$ (1/°C.).

There is a difference between the coefficient of thermal expansion of the mounting circuit board 16 and that of the semiconductor element 11. Each time the semiconductor device 17 is subjected to the temperature cycle, stress based on the above difference is exerted on the soldering bump 14.

The inventors obtained, by a computer simulation, the fatigue-based duration of life of bump electrode 10 (soldering bump 14) in accordance with the temperature cycle. Even when the AlN mounting circuit board 16 is used in such a way that the difference in the coefficient of thermal expansion is reduced, the fatigue-based duration of life of the bump electrode 10 (soldering bump 14) was approximately 2600 times.

Figure 3:
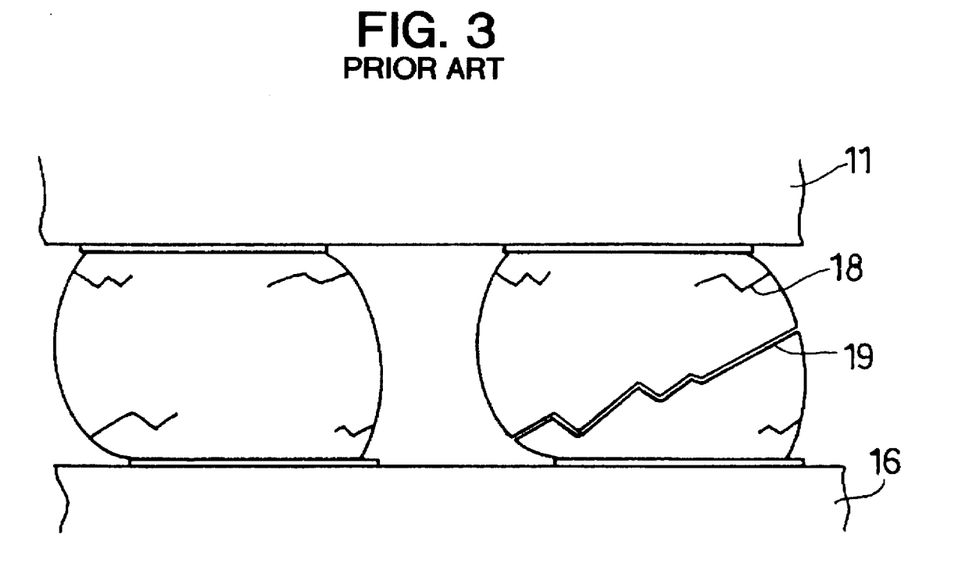
FIG. 3 is a diagram showing a disadvantage of the bump electrode shown in FIGS. 1 and 2.

As shown in FIG. 3, after a number of times that the temperature cycle is repeatedly carried out, cracks 18 occur in the soldering bump 14. When the temperature cycle has been carried out approximately 2600 times, soldering bump 14 is broken as indicated by reference number 19, and accordingly, electric conduction is broken in soldering bump 14. The duration of life of 2600 temperature cycles is not a sufficiently long period of time.

If the mounting circuit board 16 is made of glass epoxy resin in order to reduce the production cost of the semiconductor device 17, there is a large difference between the coefficient of thermal expansion of the semiconductor element 11 and that of the mounting circuit board 16. Hence, the duration of life will be greatly shorter than the duration of life of 2600 temperature cycles.

The present invention is intended to lengthen the duration of life of bump electrodes and thus semiconductor devices equipped with such bump electrodes.

Figure 4:
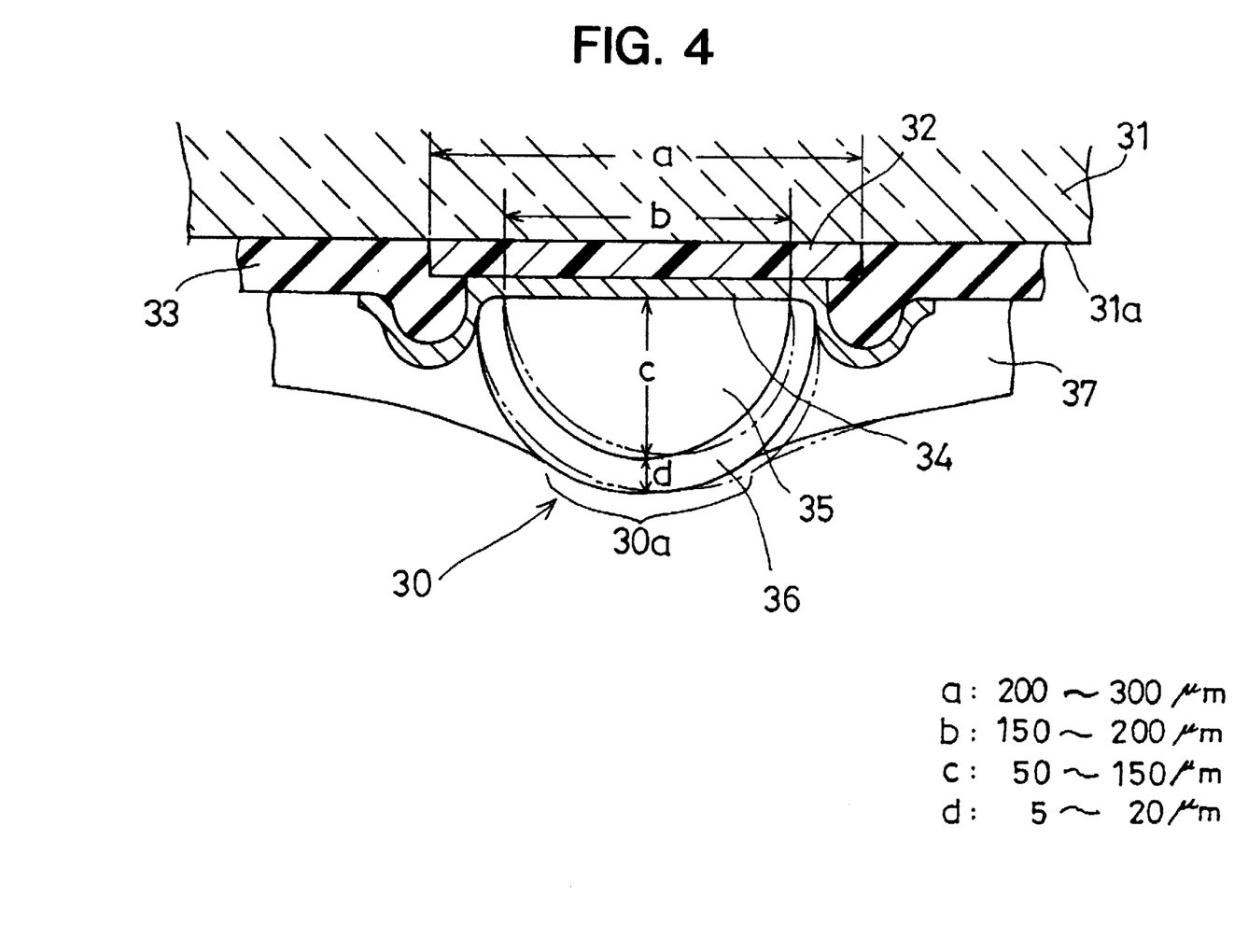
FIG. 4 is a cross-sectional view of a prior art bump electrode according to an embodiment of the present invention.

FIG. 4 shows a prior art bump electrode 30 according to an embodiment of the present invention.

A description will first be given of a structure related to bump electrode 30.

A semiconductor element 31 such as a chip to be mounted, is made of silicon, and has a lower surface 31a on which an electrode pad 32, made of aluminum, is formed. The electrode pad 32 has a diameter a of 200 to 300 μm. Further, the lower surface 31a of the semiconductor element 31 is covered by a protection film 33 made of C-PSG except for the electrode pad 32. The electrode pad 32 is covered by a metallic intermediate layer 34 serving as a metal barrier layer.

The bump electrode 30 will be described below. The bump electrode 30 is made up of a core portion 35 and an electrically conductive film 36. The core part 35 of the bump electrode 30 is made of UV (Ultraviolet)-hardening silicone resin marketed by SHINETSU SILICONE COMPANY in Japan. The core portion 35 has a reverse dome shape and is formed on the metallic intermediate layer 34. The core portion 35 has a diameter b of 150 to 200 μm, and a height of 50 to 150 μm. The Young's modulus of the UV-hardening silicone resin is $1.4 \times 10^1$ (kgf/cm²), and is approximately equal to 1/100 of the Young's modulus of soldering. Hence, the core portion 35 has a small stiffness and is flexible.

The conductive film 36 is made of gold (Au) and covers the whole surface of the core portion 35. The conductive film 36 is electrically connected to the surface of the metallic intermediate layer 34. The conductive film 36 is 5 to 20 μm thick.

The core portion 35 has a small stiffness and is flexible, and is easily deformed by a small magnitude of external force. Also, the conductive film 36 is easily deformed in response to a deformation of the core portion 35. Hence, the bump electrode 30 is easily deformed by an external force, as indicated by the two-dot chained lines shown in FIG. 4.

The bump electrode 30 is covered by the protection film 37 except for the lowermost (apex) portion 30a, the protection film 37 being made of thermoplastic silicone resin. The protection film 37 is provided taking into account the fact that the adhesion between the conductive film 36 and the core portion 35 is weak. The protection film 37 presses down the conductive film 36 in order to prevent the conductive film 36 from coming off from the core portion 35.

The protection film 37 covers the periphery of the bump electrode 30. The protection film 37 has a small Young's modulus of $1.4 \times 10^1$ (kgf/mm²), and is flexible. Hence, the protection film 37 prevents deformations of the bump electrode 30.

A description will now be given, with reference to FIG. 5, of the function of the bump electrode 30 in the state in which the semiconductor element 31 is mounted.

Figure 5:
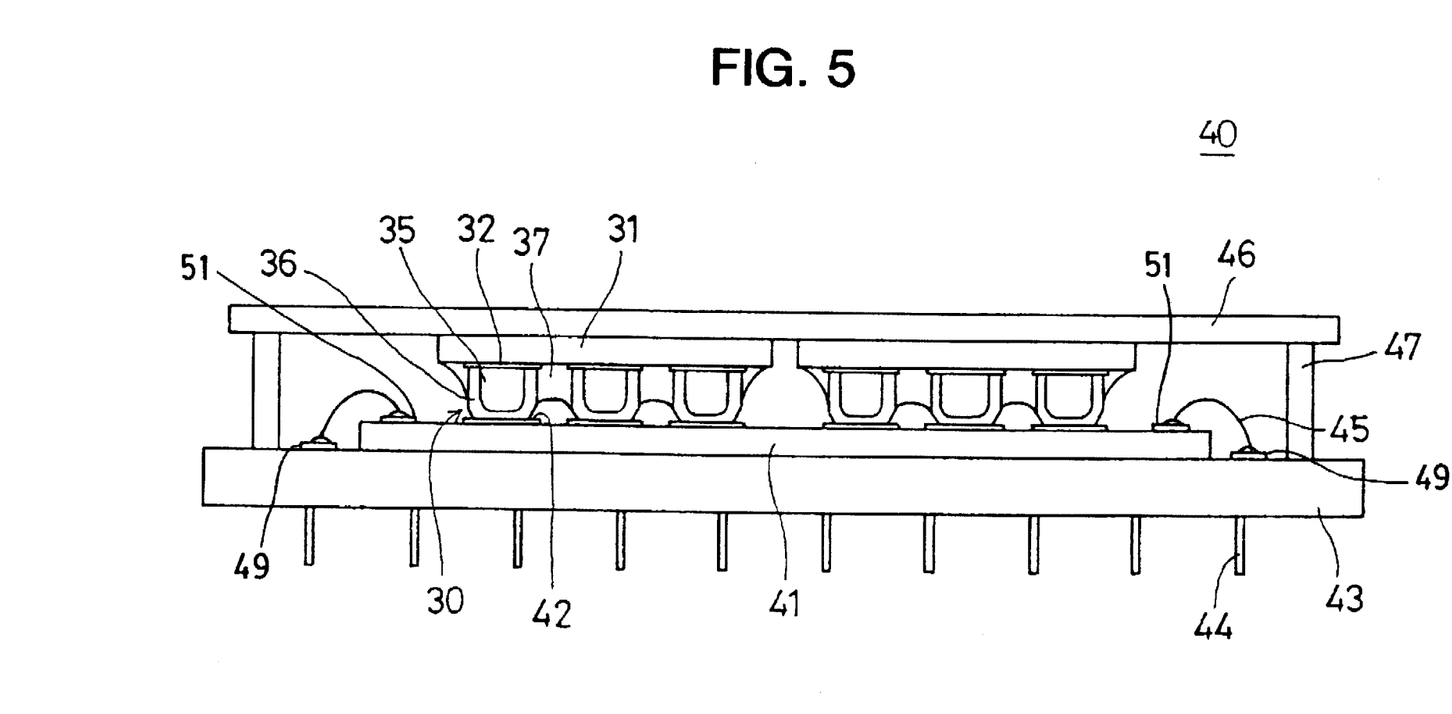
FIG. 5 is a side view of a multi-chip module using the bump electrode shown in FIG. 4.

FIG. 5 is a multi-chip module having bump electrodes having the structure shown in FIG. 4. A plurality (two in FIG. 5) of semiconductor elements 31 are mounted on an AlN mounting circuit board 41 by the flip-chip method utilizing bump electrodes 30. The bump electrodes 30 have lowermost portions, which are electrically connected to electrode pads 42 provided on the mounting circuit board 41. The semiconductor elements 31 and the mounting circuit board 41 are electrically connected via the conductive films 36 of the bump electrodes 30.

The mounting circuit board 41 is fastened to the upper surface of a package base 43. Electrodes 51 formed on the mounting circuit board 41 are electrically connected to pads 49 formed on the upper surface of the package base 43 by means of wires 45. The pads formed on the upper surface of the package base 43 are electrically connected to pin terminals 44, which project from the lower surface of the package base 43. A heat sink 46 to which the semiconductor elements 31 are attached is supported by a seal ring 47 placed on the upper surface of the package base 43, so that the semiconductor elements 31 and the mounting circuit base 41 are sealed.

Figure 6:
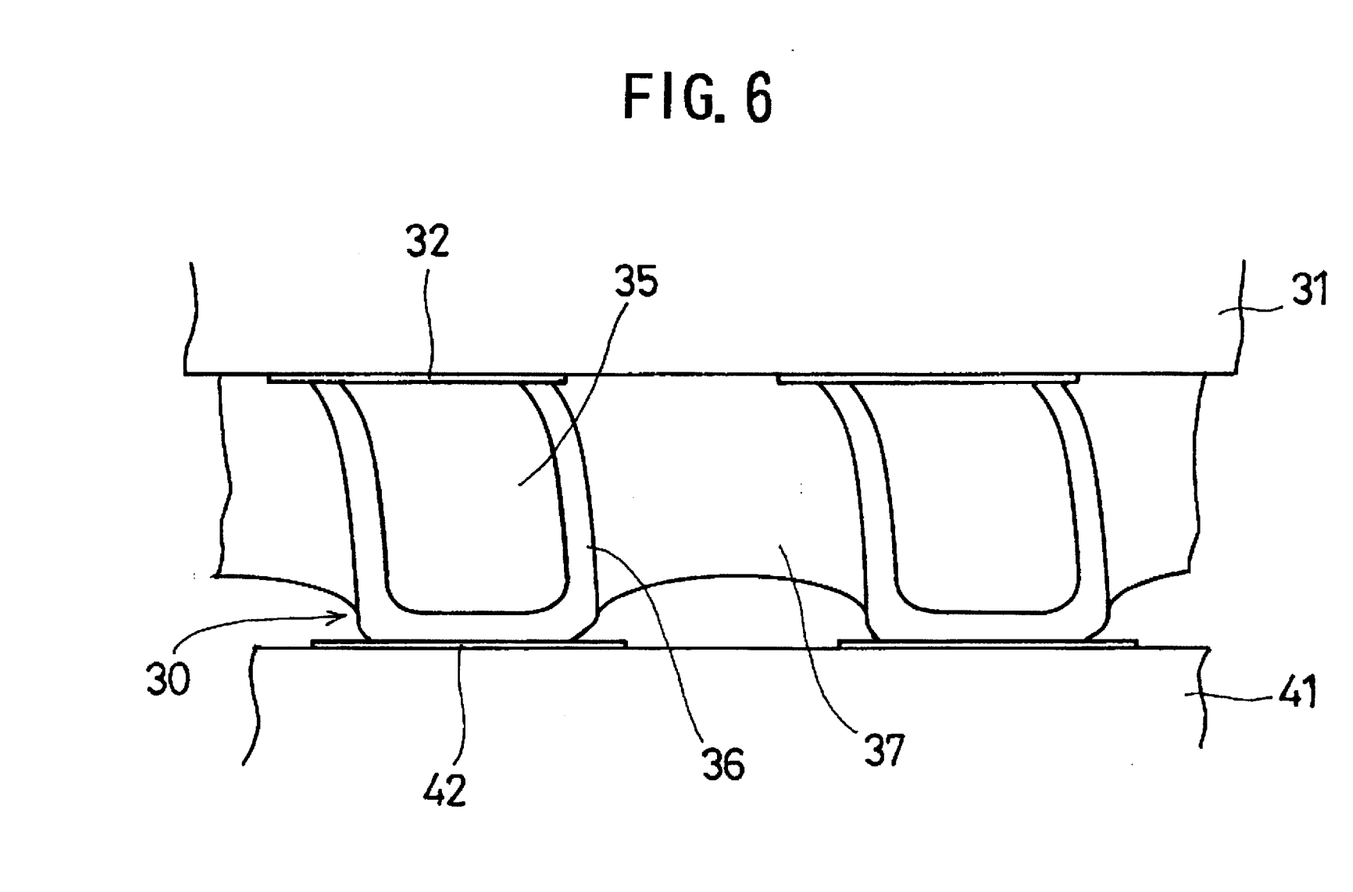
FIG. 6 is a side view showing advantages of the present invention.

While the multi-chip module 40 is operating, it radiates heats and the semiconductor elements 31 and mounting circuit board 41 are thermally expanded. A mismatch between the coefficient of thermal expansion of the semiconductor elements 31 and that of the mounting circuit board 41 can be easily absorbed due to the mechanism by which the bump electrodes 30 yields in the shearing direction of the bump electrodes 30, as shown in FIG. 6.

The inventors studied, by computer simulation, the duration of life of the bump electrodes 30 due to the temperature cycle. The obtained duration of life of the bump electrodes 30 was approximately equal to 5000 times, which is approximately twice the duration of life of the related art bump electrodes. It is thus concluded that the bump electrode 30 has a greatly longer duration of life than the related art bump electrodes.

Further, the bump electrodes 30 have the following advantages in addition to the above advantage. First, even if there are deviations in the heights of the bump electrodes 30, higher bump electrodes are deformed in the direction in which the higher bump electrodes are depressed so that the bump electrodes can be leveled. Hence, even if there are deviations in the heights of the bump electrodes 30, abnormal stress is not applied to the semiconductor elements 31 and the mounting surface board 41, and the multi-chip module 40 has a high reliability.

Second, cleaning on the mounting circuit board 41 is not needed when a defective semiconductor element is removed and a new one is mounted on the mounting circuit board 41.

A description will now be given, with reference to FIGS. 7A through 7F, of the method of producing the bump electrode 30 shown in FIG. 4.

Figure 7A:
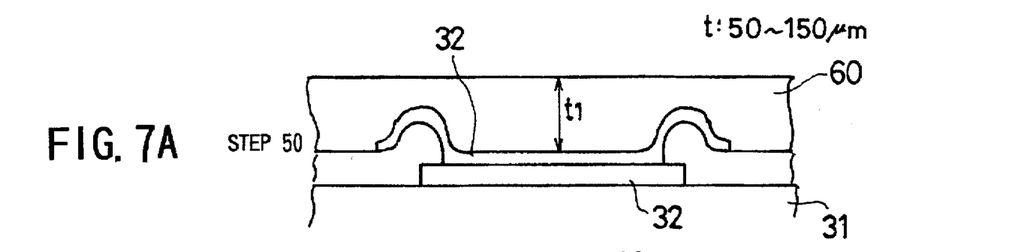
FIGS. 7A, 7B, 7C, 7D, 7E and 7F are diagrams of a method of producing the bump electrode shown in FIG. 4.

FIG. 7A shows step 50 of forming an UV-hardening silicone resin layer 60. In step 50, UV-hardening silicone resin is coated to a thickness $t_1$ of 50 to 150 μm on the surface of the semiconductor element 31 including the protection layer 33. The electrode pad 32, the protection film 33 and the metallic intermediate layer 34 have been formed on the semiconductor element 31 before step 50.

Figure 7B:
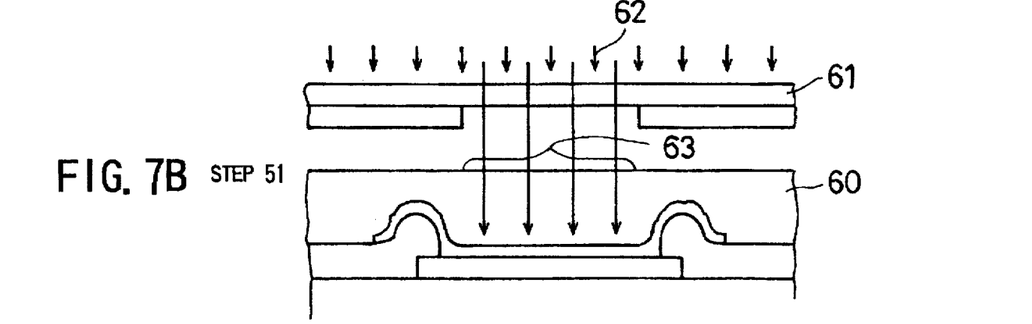

FIG. 7B shows an UV exposure step 51. In this step, a mask 61 is used and ultraviolet rays are selectively projected onto portions of the UV-hardening silicone resin layer 60 corresponding to the position of the electrode pad 32. The above portion onto which the ultraviolet rays are projected is hardened.

Figure 7C:
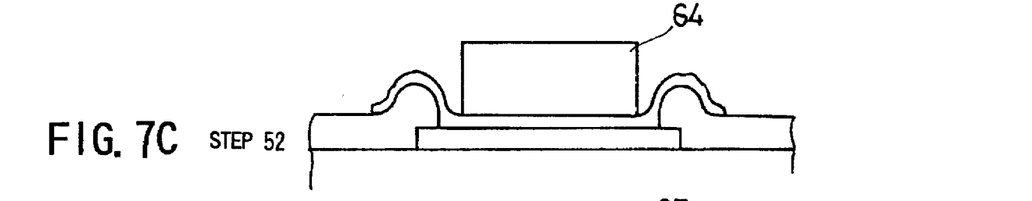

FIG. 7C shows an etching step 52. In step 52, etching is performed using an organic solvent, and the masked unexposed portion of the UV-hardening silicone resin layer 60 is removed. A projection 64 made of silicone resin remains on the metallic intermediate layer 34.

Figure 7D:
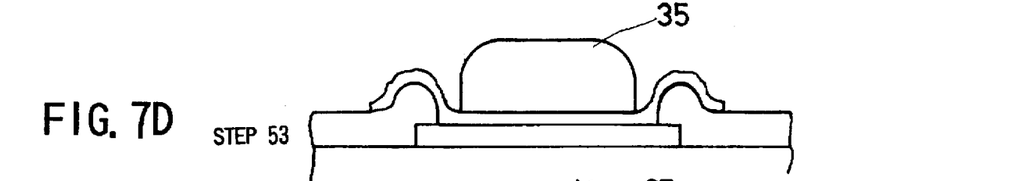

FIG. 7D shows an etching step 53, in which etching is performed by using an organic solvent so that edges of the projection 64 are removed and the projection 64 has a dome shape. The dome-shaped projection 64 corresponds to the core portion 35.

Figure 7E:
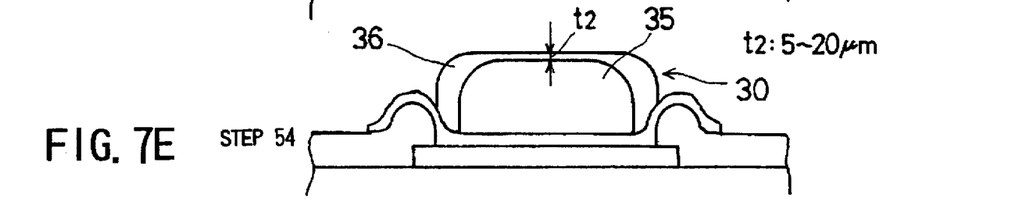

FIG. 7E shows step 54 of forming the conductive film 36. In step S54, evaporating or plating of Au is performed so that the conductive film 36 having a thickness $t_2$ of 5 to 20 μm is formed on the surface of the core portion 35. Thereby, the bump electrode 30 is formed.

Figure 7F:
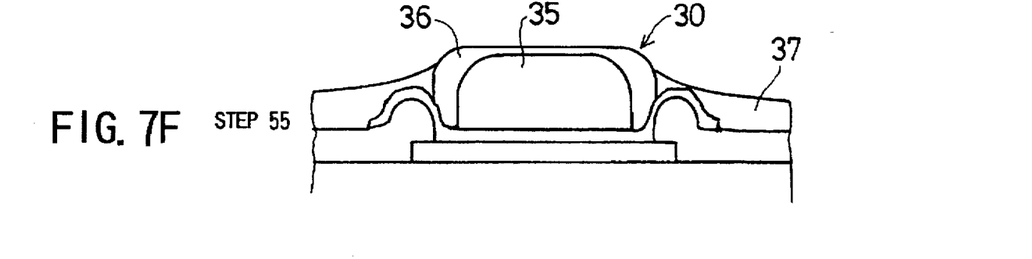

FIG. 7F shows step 55 of forming the protection film 37. In this step, thermoplasticity silicone resin is coated so that the apex portion 30a of the bump electrode 30 is exposed.

The bump electrode 30 thus formed can be applied to another element to be mounted on a circuit board. For example, an InSb infrared image sensor equipped with the bump electrode 30 can be mounted on a circuit board.

The present invention is not limited to the specifically disclosed embodiments, and variations and modifications may be made without departing from the scope of the present invention.

What is claimed is:

1. A semiconductor device, comprising:
   at least one chip upon which a prior art bump electrode arrangement is formed;
   an electrode pad on top of each said at least one chip;
   an intermediate layer on top of each said electrode pad;
   a bump electrode on top of each said intermediate layer;
   a circuit board having electrode pads and electrodes, each electrode pad of said circuit board in contact with a respective bump electrode on top of each said intermediate layer;
   a package base supporting said circuit board, said package base having pads and terminals, said terminals connected to respective pads of said package base; and
   connecting members electrically connecting respective electrodes of said circuit board to respective pads of said package base,
   each bump electrode on top of each said intermediate layer comprising:
      a core portion comprising a resin having a Young's modulus less than that of solder having a first substantially flat mounting surface for connecting to said intermediate layer, and a second surface, integral with and protruding from the first surface;
      an electrically conductive film covering said second surface and having a connection portion; and
      a protection film, of an insulating material, which partially covers said electrically conductive film of each of said bump electrode with the connection portion of said electrically conductive film exposed, said connection portion for making contact with a respective electrode pad of said circuit board.

2. The semiconductor device as claimed in claim 1, further comprising a heat sink attached to said chip.

3. The semiconductor device as claimed in claim 1, wherein said resin of said core portion of each of the plurality of bump electrodes is a silicone resin.

4. The semiconductor device as claimed in claim 1, wherein said second surface of each of the plurality of bump electrodes has a dome shape.

5. A bump electrode for interconnecting first and second members, comprising:
   a core portion comprising a resin having a Young's modulus less than that of solder having a first substantially flat mounting surface for connecting to the first member, and a second surface, integral with and protruding from the first surface;
   an electrically conductive film covering said second surface and having a connection portion; and
   a protection film, of an insulating material, which partially covers said electrically conductive film with the connection portion of said electrically conductive film exposed, said connection portion of said electrically conductive film for making contact with the second member.

6. The bump electrode as claimed in claim 5, wherein said resin is a silicone resin.

7. The bump electrode as claimed in claim 5, wherein said second surface has a dome shape.

8. A semiconductor device, comprising:
   a chip;
   an electrode pad connected to said chip;
   an intermediate layer connected to said electrode pad;
   a plurality of bump electrodes, each of said bump electrodes comprising:
      a core portion comprising a resin having a Young's modulus less than that of solder, having a first substantially flat mounting surface for connecting to said intermediate layer, and a second surface, integral with and protruding from the first surface;
      an electrically conductive film covering said second surface and having a connection portion; and
      a protection film, of an insulating material, which partially covers said electrically conductive film with the connection portion of said electrically conductive film exposed, said connection portion for making contact with an electrode pad on which said semiconductor device is to be mounted.

9. The semiconductor device as claimed in claim 8, wherein said resin is a silicone resin.

10. The semiconductor device as claimed in claim 8, wherein said second surface has a dome shape.

11. A method for producing an electrode bump for interconnecting first and second members, said method comprising the steps of:
   (a) forming a core portion comprising a resin having a Young's modulus less than that of solder having a first substantially flat mounting surface for connecting to the first member, and a second surface, integral with and protruding from the first surface;
   (b) forming an electrically conductive film covering said second surface and having a connection portion; and
   (c) forming a protection film, of an insulating material, which partially covers said electrically conductive film with the connection portion of said electrically conductive film exposed, said connection portion of said electrically conductive film for making contact with an electrode pad on which said semiconductor device is to be mounted.

12. The method as claimed in claim 11, further comprising the steps of:
   (d) forming an ultraviolet-hardening silicone resin on the surface of said first member; and
   (e) patterning the ultraviolet-hardening silicone resin to form a projection, said projection corresponding to said second surface of said core portion of said bump electrode.

13. The method as claimed in claim 12, wherein said step (a-2) further comprises the step of removing edges from said projection.

14. A method for producing a semiconductor device, comprising:
   (a) forming an electrode pad on a surface of a semiconductor element;
   (b) forming an intermediate layer on said electrode pad,
   (c) forming a core portion on said intermediate layer, said core portion comprising a resin having a Young's modulus less than that of solder having a first substantially flat mounting surface for connecting to said intermediate layer, and a second surface, integral with and protruding from the first surface;
   (d) forming an electrically conductive film covering said second surface and having a connection portion; and
   (e) forming a protection film comprising an insulating material on said electrically conductive film except for the connection portion of said electrically conductive film, electrically connecting said connection portion of said electrically conductive film to an electrode pad of a circuit board, and
   electrically connecting an electrode of said circuit board to a pad of a package base which supports said circuit board.

15. The method as claimed in claim 14, further comprising:
   (a-1) forming an ultraviolet-hardening silicone resin on said surface of said semiconductor element and on said intermediate layer; and
   (a-2) patterning said ultraviolet-hardening silicone resin to form a projection, said projection corresponding to said second surface of said core portion of said bump electrode.

16. The method as claimed in claim 15, wherein said step (a-2) further comprises the step of removing edges from said projection.

17. A bump electrode, comprising:
   a core portion comprising a resin having a Young's modulus less than that of solder having a first substantially flat mounting surface for electrical connection, and a second surface, integral with and protruding from the first surface;
   a conductive film formed on said second surface and having a connection portion; and
   a protection film on said conductive film except for the connection portion of said conductive film.

18. The bump electrode of claim 17, wherein said core portion has a diameter of from 150 to 200 μm and a height of 50 to 150 μm.

19. A apparatus, comprising:
   a bump electrode, having an electrically conductive film formed on a surface thereof and having a connection contact region; and
   a protection film, of an insulating material, partially covering the electrically conductive film with the connection contact region of the electrically conductive film exposed.

20. A method for producing an apparatus, comprising:
   (a) forming a bump electrode;
   (b) forming an electrically conductive film on said bump electrode having a connection contact region; and
   (c) forming a protective film, of an insulating material, partially covering said electrically conductive film wherein said connection contact region is exposed.

* * * * *

UNITED STATES PATENT AND TRADEMARK OFFICE
CERTIFICATE OF CORRECTION

PATENT NO. : 5,666,270
DATED : September 9, 1997
INVENTOR(S) : MATSUDA et al.

It is certified that error appears in the above-identified patent and that said Letters Patent is hereby corrected as shown below:

Col. 2, lines 2-3, delete "prior art";
line 36, delete "prior art".

Col. 3, line 40, delete "prior art";
lines 41-42, delete the paragraph break;
line 44, after "31" insert --,--;
line 47, change "a" to --a--;
line 61, change "b" to --b--.

Col. 5, line 43, change "thermoplasticity" to --thermoplastic--;
line 55, delete "prior art".

Signed and Sealed this

Twentieth Day of January, 1998

Attest:

BRUCE LEHMAN

Attesting Officer

Commissioner of Patents and Trademarks